United States Patent
Oh

(10) Patent No.: US 7,732,903 B2
(45) Date of Patent: Jun. 8, 2010

(54) HIGH CAPACITY MEMORY MODULE USING FLEXIBLE SUBSTRATE

(75) Inventor: Jae Sung Oh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 274 days.

(21) Appl. No.: 11/760,182

(22) Filed: Jun. 8, 2007

(65) Prior Publication Data
US 2008/0157317 A1 Jul. 3, 2008

(30) Foreign Application Priority Data
Dec. 29, 2006 (KR) .................... 10-2006-0138474

(51) Int. Cl.
*H01L 23/02* (2006.01)
(52) U.S. Cl. ................ 257/678; 257/E21.511
(58) Field of Classification Search ................ 257/678, 257/E21.511
See application file for complete search history.

(56) References Cited

U.S. PATENT DOCUMENTS

| | | | |
|---|---|---|---|
| 5,061,990 A | 10/1991 | Arakawa et al. | |
| 6,310,392 B1 | 10/2001 | Burns | |
| 6,335,563 B1 * | 1/2002 | Hashimoto | 257/632 |
| 6,589,810 B1 * | 7/2003 | Moden | 438/106 |
| 2004/0080032 A1 * | 4/2004 | Kimura et al. | 257/678 |
| 2006/0113643 A1 * | 6/2006 | Loo et al. | 257/666 |

FOREIGN PATENT DOCUMENTS

| | | |
|---|---|---|
| JP | 08-125068 | 5/1996 |
| KR | 1020060134969 | 12/2006 |
| KR | 1020060134969 A | 12/2006 |

* cited by examiner

*Primary Examiner*—Thao X Le
*Assistant Examiner*—Elias Ullah
(74) *Attorney, Agent, or Firm*—Ladas & Parry LLP

(57) ABSTRACT

A memory module includes a module substrate and a plurality of package units mounted to the module substrate such that they partially overlap each other. Each package unit has at least one memory semiconductor package attached thereto. Each package unit includes a flexible substrate, which has outer terminals provided over a lower surface adjacent to one edge thereof to form electrical connections with the module substrate, and the memory semiconductor package attached to one surface or each of both upper and lower surfaces of the flexible substrate.

13 Claims, 5 Drawing Sheets

HIGH CAPACITY MEMORY MODULE USING FLEXIBLE SUBSTRATE

CROSS-REFERENCE TO RELATED APPLICATIONS

The present application claims priority to Korean patent application number 10-2006-0138474 filed on Dec. 29, 2006, which is incorporated herein by reference in its entirety.

BACKGROUND OF THE INVENTION

The present invention relates to a memory module, and more particularly to a memory module, which is configured to increase capacity and improve the mounting reliability of a semiconductor package.

The packaging technologies for semiconductor integrated circuits have been continuously developed to meet the demands for miniaturization and mounting reliability. For example, the demand for miniaturization has advanced the technology development of packages to reduce the package size to approach the size of a chip, and the demand for mounting reliability has highlighted the importance of the technology related to improving efficiency of the mounting tasks and improving mechanical and electrical reliability after the mounting.

As miniaturization and high functionality are required for electronic devices, development of high capacity memory modules has been the focus of various technology development efforts.

High integration of memory cells is one method available to realize a high capacity memory module; however, high integration of as much as possible in number of memory cells on a limited size available in a semiconductor chip is not easy to accomplish, as it not only requires the high precision technology such as that for attaining the precise and fine line widths is required for high integration of memory cells but also requires a rather lengthy development period.

Therefore, as a different approach to realize high capacity memory modules, the technology trend is directed to developing new ways to mount more number of packages in a limited space.

Nevertheless, depending on the size of each individual package, only a certain number of packages can be mounted to a limited-size module substrate. This places limitations on the extent that the capacity of a memory module can be increased.

Further, in fabricating memory modules, solder balls in general are used to mount a number of packages on a module substrate. In such a case, the solder joint reliability is likely to be degraded due to certain undesirable solder ball characteristics, and this will lead to degradation of the reliability of the memory module as a whole.

SUMMARY OF THE INVENTION

An embodiment of the present invention is directed to a memory module, which is configured to increase capacity.

Another embodiment of the present invention is directed to a memory module, which is configured to improve the mounting reliability of a semiconductor package.

In one embodiment, a memory module comprises a module substrate; and a plurality of package units mounted to or set on the module substrate such that they partially overlap one another, each package unit having at least one memory semiconductor package attached thereto, wherein each package unit includes a flexible substrate which has outer terminals provided over a lower surface adjacent to one edge thereof to form electrical connections with the module substrate, and the memory semiconductor package attached to one surface or each of both upper and lower surfaces of the flexible substrate.

The flexible substrate comprises a polyimide-based layer; a circuit pattern formed over at least one of upper and lower surfaces of the layer and having ball lands and the outer terminals located over the lower surface adjacent to one edge of the layer; and an insulation layer formed over the layer to cover the circuit pattern excluding the ball lands and the outer terminals.

The circuit pattern is formed only over the upper surface of the polyimide-based layer.

The circuit pattern is formed over both upper and lower surfaces of the polyimide-based layer.

The package units are mounted only to an upper surface of the module substrate.

The package units are mounted to both upper and lower surfaces of the module substrate.

Each package unit has a structure in which the memory semiconductor package is attached only to the upper surface of the flexible substrate.

Each package unit has a structure in which the memory semiconductor package is attached to each of the upper and lower surfaces of the flexible substrate.

The memory semiconductor package is electrically connected with the flexible substrate by way of solder balls.

The memory semiconductor package comprises a substrate; a memory semiconductor chip attached to the substrate; metal wires for electrically connecting the substrate and the memory semiconductor chip with each other; a molding material for molding an upper surface of the substrate including the memory semiconductor chip and the metal wires; and solder balls attached to a lower surface of the substrate.

The plurality of package units are respectively mounted to the module substrate such that a portion of another adjoining package unit is placed under or over an opposite edge of the flexible substrate of one package unit which is not provided with the outer terminals.

The package units are mounted to the module substrate by means of any one selected from group consisting of solder, anisotropic conductive film and connector.

DESCRIPTION OF SPECIFIC EMBODIMENTS

In the present invention, a plurality of package units that are attached to one or both surfaces of a flexible substrate are prepared, and then the plurality of package units are mounted to or set on a module substrate such that the package units partially overlap each other, whereby a memory module is realized.

Accordingly in the present invention, when compared to the conventional art in which memory semiconductor packages are directly mounted to a module substrate having a limited size, it is possible to mount an increased number of memory semiconductor packages to the module substrate. As a result, a memory module having high capacity can be realized. Also, in the present invention, since the memory semiconductor package is mounted to or set on the module substrate by the medium of the flexible substrate, the reliability of the solder joints can be improved, by which the reliability of the memory module can be improved, when compared to the conventional art in which the memory semiconductor package is directly mounted to the module substrate using solder balls.

An embodiment of the present invention will be described below with reference to the attached drawings for detail.

Figure 1A:
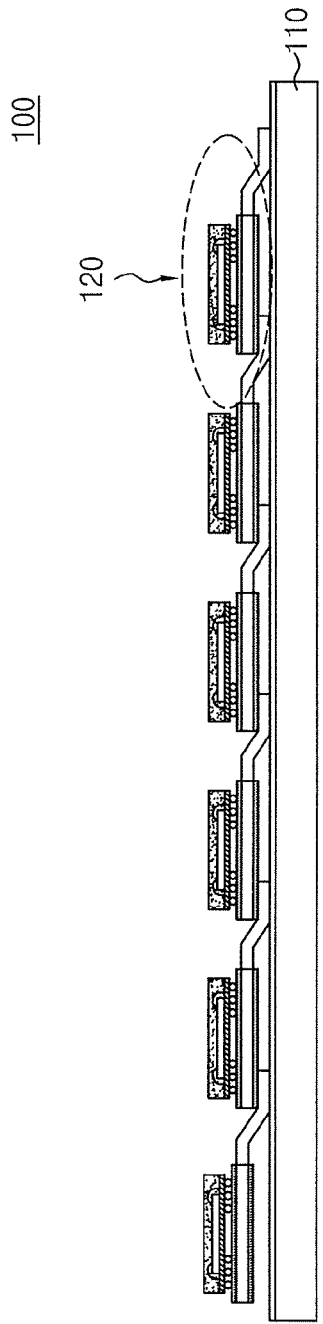
FIGS. 1A-1B are cross-sectional views of a memory module and a semiconductor package unit mounted in the memory module, respectively, in accordance with a first embodiment of the present invention.
Figure 1B:
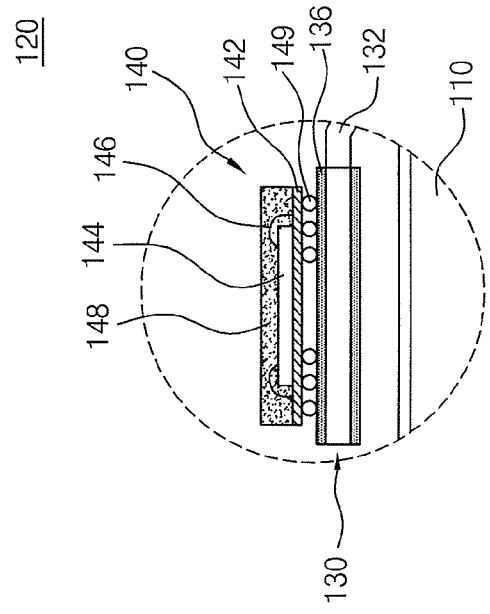
Figure 2A:
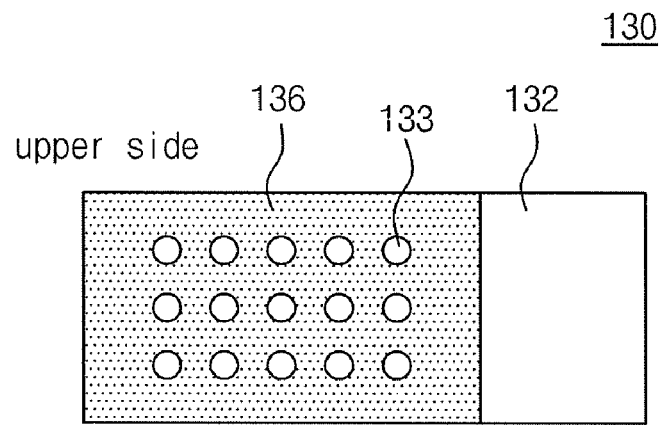
FIGS. 2A-2B show the flexible substrate of the memory module in accordance with the first embodiment of the present invention.
Figure 2B:
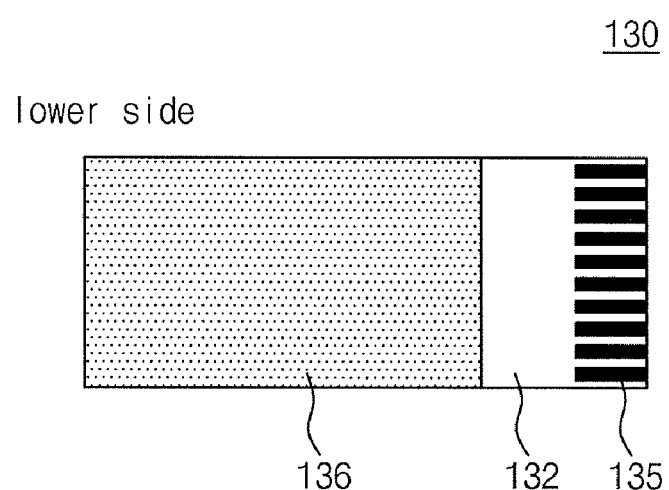

FIGS. 1A-1B show a cross-sectional view of a memory module and a semiconductor package unit 120 mounted in the memory module, respectively, in accordance with a first embodiment of the present invention, and FIGS. 2A-2B are views showing the flexible substrate 130 of the memory module in accordance with the first embodiment of the present invention.

Referring to FIG. 1A, a memory module 100 is configured such that a plurality of package units 120 are mounted to a module substrate 110 to partially overlap each other. Each package unit 120 (now referring to FIG. 1B) includes a memory semiconductor package 140 attached to the upper surface of a flexible substrate 130. Each package unit 120 is mounted to the module substrate 110 by way of the flexible substrate 130.

The flexible substrate 130 is made of a polyimide-based layer 132. A circuit pattern (not shown) is formed over at least one of the upper and lower surfaces of the layer 132 and has ball lands 133 (now refer to FIG. 2A), and outer terminals 135 which are located over the lower surface of and adjacent to one edge of the layer 132. An insulation layer 136 is formed on the layer 132 to cover the circuit pattern excluding the ball lands 133 and the outer terminals 135. The outer terminals 135 may be formed through plating. The circuit pattern in FIG. 2A may be understood as being formed only on the upper surface of the layer 132.

The module substrate 110 is formed with circuit wirings and has a plurality of electrode terminals (not shown) on portions thereof where it is brought into contact with the outer terminals 135 of the flexible substrate 130 of each package unit 120.

The memory semiconductor package 140 (now referring back to FIG. 1B) is attached to the upper surface of the flexible substrate 130. In the memory semiconductor package 140, a memory semiconductor chip 144 is attached to the upper surface of a printed circuit board 142, and the memory semiconductor chip 144 and the printed circuit board 142 are electrically connected to each other by metal wires 146. The upper surface of the printed circuit board 142 including the metal wires 146 and the memory semiconductor chip 144 is molded using a molding material 148. A plurality of solder balls 149 are attached to the lower surface of the printed circuit board 142. The memory semiconductor package 140 is attached to the upper surface of the flexible substrate 130 by way of the solder balls 149.

The flexible substrate 130 can be mounted to the module substrate 110 by soldering using a solder. The mounting of the flexible substrate 130 can also be implemented using a connector or an anisotropic conductive film in place of the solder. Specifically, the mounting of the package units 120 by the medium of the flexible substrates 130 is implemented in a manner such that adjoining package units 120 partially overlap each other. Preferably, the package units 120 are mounted so that maximum 50% of the overall size of each package unit 120 is overlapped. At this time, a portion of the flexible substrate 130 (referring to FIGS. 2A-2B), that is, the portion of the flexible substrate 130 which is provided with the outer terminals 135 is down-set to be easily mounted to the module substrate 110. Therefore, in an embodiment of the present invention, the mounting area of the module substrate 110 can be minimized, and consequently, an increased number of memory semiconductor packages 140 can be mounted to the module substrate 110 having a fixed size.

As described above, in the memory module 100 according to this first embodiment, since a plurality of package units 120 each having a flexible substrate 130 are mounted to a module substrate 110 such that the package units 120 partially overlap each other, the mounting area of the module substrate 110 can be decreased. Moreover, because the package units 120 are mounted to the module substrate 110 by way of flexible substrates 130, the reliability of the solder joints is improved.

Figure 3:
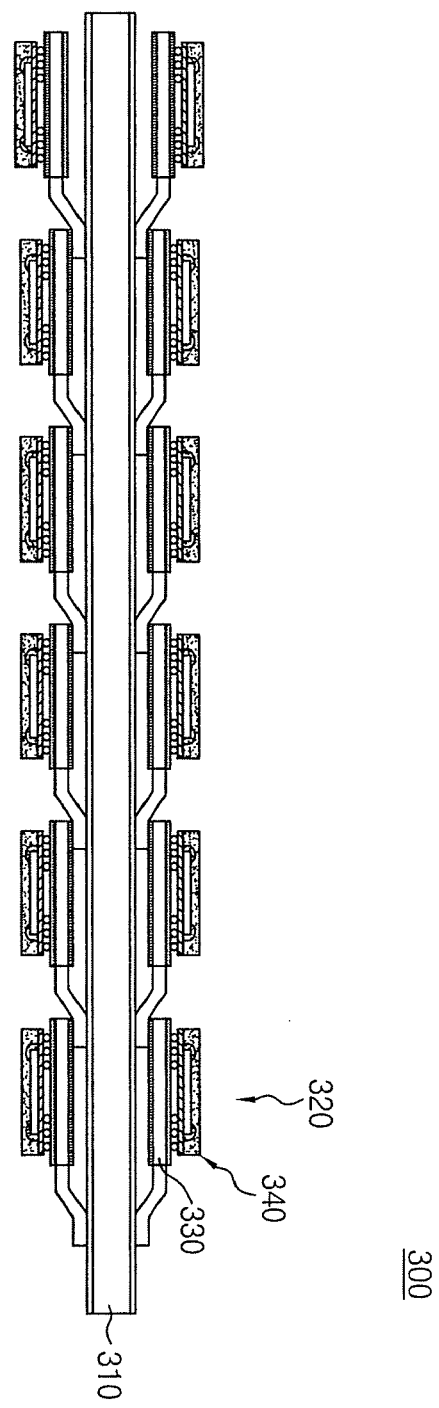
FIG. 3 is a cross-sectional view illustrating a memory module in accordance with a second embodiment of the present invention.

FIG. 3 is a cross-sectional view illustrating a memory module in accordance with a second embodiment of the present invention.

Referring to FIG. 3, when compared to the memory module 100 of the first embodiment, a memory module 300 according to a second embodiment of the present invention is configured such that a plurality of package units 320 are mounted to both upper and lower surfaces of a module substrate 310. In other words, in the memory module 300 according to this second embodiment of the present invention, the package units 320 are mounted such that they are symmetric about the module substrate 310. The reference numeral 330 designates a flexible substrate, and 340 designates a memory semiconductor package.

Therefore, when compared to the memory module 100 of the first embodiment, the mounting efficiency of the memory module 300 is increased, since more number of package units 320 having the memory semiconductor packages 340 can be mounted to the module substrate 310, realizing a memory module 300 with even higher memory capacity than the memory module 100 shown in FIG. 1A.

In this second embodiment, it can be understood that electrode terminals (not shown) are provided on both upper and lower surfaces of the module substrate 310.

It should be readily understood that the other component elements of the memory module 300 besides the module substrate 310 according to this second embodiment can be same as those of the first embodiment shown in FIGS. 1A-1B and 2A-2B.

Figure 4:
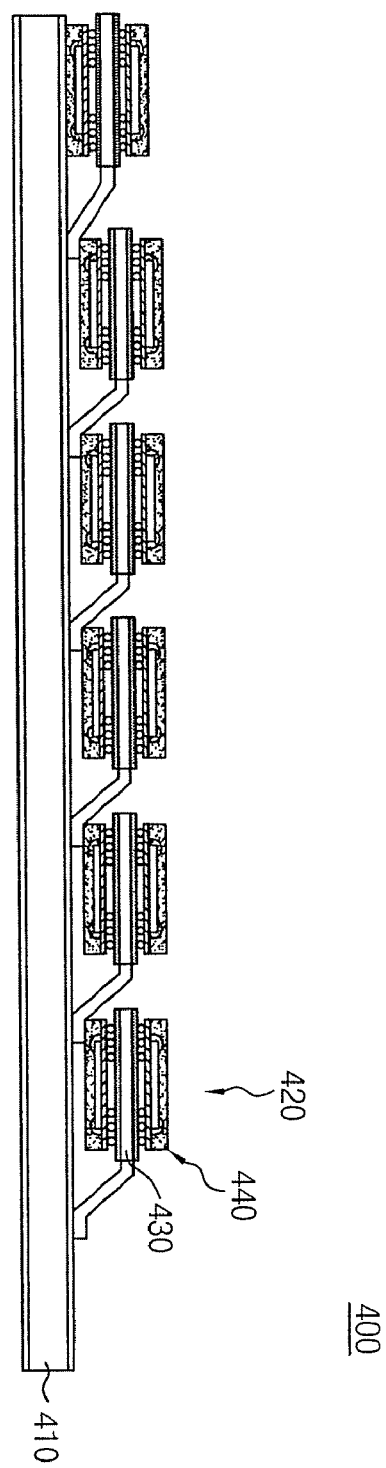
FIG. 4 is a cross-sectional view illustrating a memory module in accordance with a third embodiment of the present invention.

FIG. 4 is a cross-sectional view illustrating a memory module in accordance with a third embodiment of the present invention.

Referring to FIG. 4, a memory module 400 according to a third embodiment of the present invention is configured in a manner such that memory semiconductor packages 440 are respectively attached to both upper and lower surfaces of a flexible substrate 430. In other words, in the memory module 400, the memory semiconductor packages 440 are attached to the flexible substrate 430 such that they are symmetric about the flexible substrate 430. The reference numeral 410 designates a module substrate, and 420 designates a package unit.

Therefore, when compared to the memory module 100 of the first embodiment, the mounting efficiency of the memory module 400 is increased, since more number of memory semiconductor packages 440 can be mounted to the flexible substrate 430, thereby producing a memory module 400 with even higher capacity than the memory module 100 shown in FIG. 1.

In this third embodiment, it can be understood that ball lands (not shown) are provided on both upper and lower surfaces of the flexible substrate 430, and, in conformity to this, an insulation layer of the flexible substrate 430 is patterned to accommodate the ball lands.

It should be readily understood that other component elements of the memory module 400 according to this third embodiment can be same as those of the first embodiment shown in FIGS. 1A-1B and 2A-2B.

Figure 5:
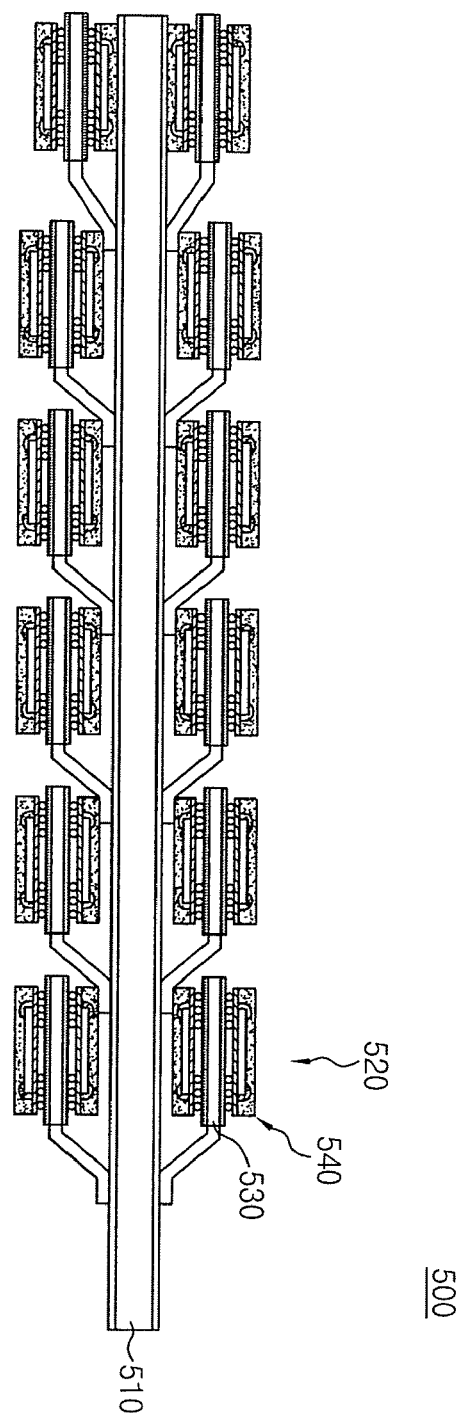
FIG. 5 is a cross-sectional view illustrating a memory module in accordance with a fourth embodiment of the present invention.

FIG. 5 is a cross-sectional view illustrating a memory module in accordance with a fourth embodiment of the present invention.

Referring to FIG. 5, when compared to the memory module 100 according to the first embodiment, a memory module 500 according to a fourth embodiment of the present invention is configured such that package units 520 are mounted to both upper and lower surfaces of a module substrate 510, and in each package unit 520, memory semiconductor packages 540 are attached to both upper and lower surfaces of a flexible substrate 530.

Therefore, when compared to the memory modules 100, 300, 400 of the first through third embodiments, the memory module 500 according to this fourth embodiment accommodates more number of memory semiconductor packages 540 to be mounted to the module substrate 510, and thus, the memory module 500 of the fourth embodiment would have the highest capacity.

In this fourth embodiment, it can be understood that electrode terminals (not shown) are provided on both upper and lower surfaces of the module substrate 510 and ball lands (not shown) are provided on both upper and lower surfaces of the flexible substrate 530.

It should be readily recognized that the other component elements of the memory module 500 according to this fourth embodiment besides those mentioned above are same as those of the first embodiment shown in FIGS. 1A-1B and 2A-2B.

The above embodiments are described based on the memory semiconductor package being a ball grid array (BGA) package, but it should be readily understood that the present invention can also be applied to a thin small outline package (TSOP), a double die package (DDP), a flip chip package (FCP), etc.

As is apparent from the above description, in the present invention, since a plurality of package units prepared using flexible substrates are mounted to a module substrate in such a way as to partially overlap one another, an increased number of memory semiconductor packages can be mounted to the module substrate. Accordingly, a memory module having high capacity can be realized in the present invention. Further, because the present invention allows more number of memory semiconductor packages to be mounted to the module substrate, the size of the memory of the present invention would be smaller than the other memory modules of same or similar memory capacity.

In addition, in the present invention, since the memory semiconductor package is mounted to the module substrate by the medium of the flexible substrate, the reliability of a solder joint is improved, whereby the reliability of the memory module is improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A memory module comprising:
   a module substrate; and
   a plurality of package units set on the module substrate such that the package units partially overlap each other, each package unit comprising:
   at least one memory semiconductor package; and
   a flexible substrate having outer terminals provided over a lower surface of the flexible substrate adjacent to one edge thereof to form electrical connections with the module substrate,
   wherein the memory semiconductor package is attached to one surface or each of both upper and lower surfaces of the flexible substrate;
   wherein the portion of the flexible substrate which is provided with the outer terminals is down-set such that the outer terminals are disposed at the overlapped portion of the package units;
   wherein the plurality of package units are respectively set on the module substrate such that a portion of the memory semiconductor package of another adjoining package unit overlaps the flexible substrate and is placed over an opposite edge of the flexible substrate of one package unit which is not provided with the outer terminals; and
   wherein the electrical connections are made to bring the outer terminals into contact with a plurality of electrode terminals of the module substrate disposed at corresponding positions to the outer terminals.

2. The memory module according to claim 1, wherein the flexible substrate comprises:
   a polyimide-based layer;
   a circuit pattern formed over at least one of upper and lower surfaces of the polyimide-based layer and having ball lands and the outer terminals located over the lower surface adjacent to one edge of the polyimide-based layer; and
   an insulation layer formed over the polyimide-based layer to cover the circuit pattern excluding the ball lands and the outer terminals.

3. The memory module according to claim 2, wherein the circuit pattern is formed only over the upper surface of the polyimide-based layer.

4. The memory module according to claim 2, wherein the circuit pattern is formed over both upper and lower surfaces of the polyimide-based layer.

5. The memory module according to claim 1, wherein the package units are set only on an upper surface of the module substrate.

6. The memory module according to claim 1, wherein the package units are set on both upper and lower surfaces of the module substrate.

7. The memory module according to claim 1, wherein each package unit has a structure in which the memory semiconductor package is set only on the upper surface of the flexible substrate.

8. The memory module according to claim 1, wherein each package unit comprises the memory semiconductor package set on each of the upper and lower surfaces of the flexible substrate.

9. The memory module according to claim 1, wherein the memory semiconductor package is electrically connected to the flexible substrate via solder balls.

10. The memory module according to claim 9, wherein the memory semiconductor package comprises:

a package substrate;

a memory semiconductor chip attached to the package substrate;

metal wires for electrically connecting the package substrate and the memory semiconductor chip;

a molding material for molding an upper surface of the package substrate including the memory semiconductor chip and the metal wires; and solder balls attached to a lower surface of the package substrate.

11. The memory module according to claim 1, wherein the package units are set on the module substrate via any one selected from group consisting of solder, anisotropic conductive film and connector.

12. The memory module according to claim 1, wherein the memory semiconductor package is attached such that at least a portion of the memory semiconductor package is disposed on the overlapped portion of the package units.

13. The memory module according to claim 1, wherein the memory semiconductor package is attached to at least the upper surface of the flexible substrate so as to be disposed over the overlapped portion.

\* \* \* \* \*